United States Patent [19]
Shinagawa

[11] Patent Number: 5,628,871
[45] Date of Patent: May 13, 1997

[54] METHOD OF REMOVING RESIST MASK AND A METHOD OF MANUFACTURING SEMICONDUCTOR DEVICE

[75] Inventor: Keisuke Shinagawa, Kawasaki, Japan

[73] Assignee: Fujitsu Limited, Kanagawa, Japan

[21] Appl. No.: 264,915

[22] Filed: Jun. 24, 1994

[30] Foreign Application Priority Data

Sep. 17, 1993 [JP] Japan .................. 5-232018

[51] Int. Cl.$^6$ .................................. H01L 21/312
[52] U.S. Cl. .................. 438/514; 438/704; 438/725; 438/714
[58] Field of Search .................. 156/643, 646, 156/651, 659.1; 437/229, 20, 22, 931; 148/DIG. 83

[56] References Cited

U.S. PATENT DOCUMENTS

| | | | |
|---|---|---|---|
| 4,040,083 | 8/1977 | Saiki et al. | 437/236 |
| 4,789,427 | 12/1988 | Fujimura et al. | 156/643 |
| 4,861,424 | 8/1989 | Fujimura et al. | 156/643 |
| 4,861,732 | 8/1989 | Fujimura et al. | 437/229 |
| 4,938,839 | 7/1990 | Fujimura et al. | 156/643 |
| 4,980,022 | 12/1990 | Fujimura et al. | 156/643 |

OTHER PUBLICATIONS

S. Wolf "Silicon Processing for the VLSI Era; Process Technology", vol. 1., 534, 1986.

Primary Examiner—John Niebling
Assistant Examiner—Thomas G. Bilodeau
Attorney, Agent, or Firm—Nikaido Marmelstein Murray & Oram LLP

[57] ABSTRACT

The present invention relates to a method of manufacturing a semiconductor device including a process of removing a photoresist mask or a photosensitive polyimide mask remaining after implanting impurity ions into a semiconductor layer or the like, and has an object to prevent generation of oxides of impurities and photoresist explosion and arranging it so that no residue remains. The present invention comprises the steps of forming a mask composed of photosensitive organic matter on a layer, implanting impurity ions into the layer through the mask, and removing the mask through processing including three steps of: exposing the mask to a plasma activated gas containing hydrogen, exposing to the mask to a plasma activated gas containing oxygen, and exposing the mask to a solution containing nitric acid under conditions sufficient to dissolve alumina which had formed on the mask during exposure of the mask to oxygen.

18 Claims, 8 Drawing Sheets

METHOD OF REMOVING RESIST MASK AND A METHOD OF MANUFACTURING SEMICONDUCTOR DEVICE

BACKGROUND OF THE INVENTION

1. Field of the Invention

The present invention relates to a method of removing a resist mask and a method of manufacturing a semiconductor device, and more particularly to a method of removing a photoresist mask or a photosensitive polyimide mask which remains after implanting impurity ions selectively into a semiconductor substrate to form a conductive layer or a steel or the like to improve hardness and persistence and a method of manufacturing a semiconductor device including a process of removing a resist mask.

In a method of manufacturing a semiconductor device, it is required to introduce impurities such as boron and phosphorus into a semiconductor substrate or the like selectively by ion implantation in order to form a pn junction such as a source/drain region and the other conductive layers in a semiconductor layer, a semiconductor substrate or the like.

In such a case, such a process is to form a mask using a photoresist or a photosensitive polyimide and to remove the mask after ion implantation is performed.

2. Description of the Prior Art

FIG. 1A to FIG. 1E are sectional views showing how to remove a photoresist mask after conducting ion implantation selectively into a semiconductor substrate for instance using a photoresist mask.

Figure 1A:
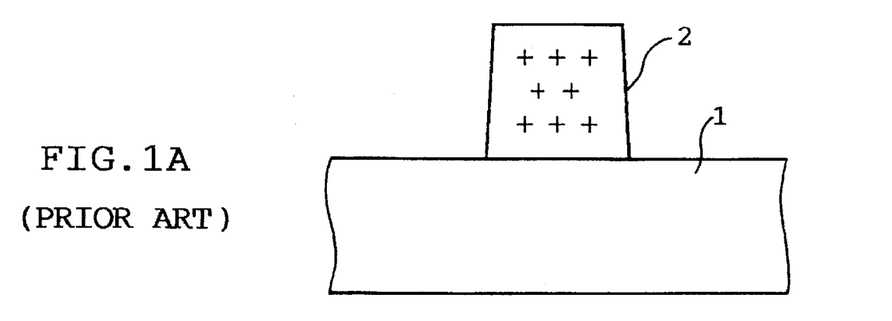
FIG. 1A to FIG. 1E are sectional views showing a conventional method of manufacturing a semiconductor device including a method of removing a photoresist mask.

First, a photoresist mask is formed on a semiconductor substrate 1 by spin coating. Then, after exposing the photoresist film, it is soaked in a developer and a photoresist mask 2 is formed as shown in FIG. 1A.

Figure 1B:
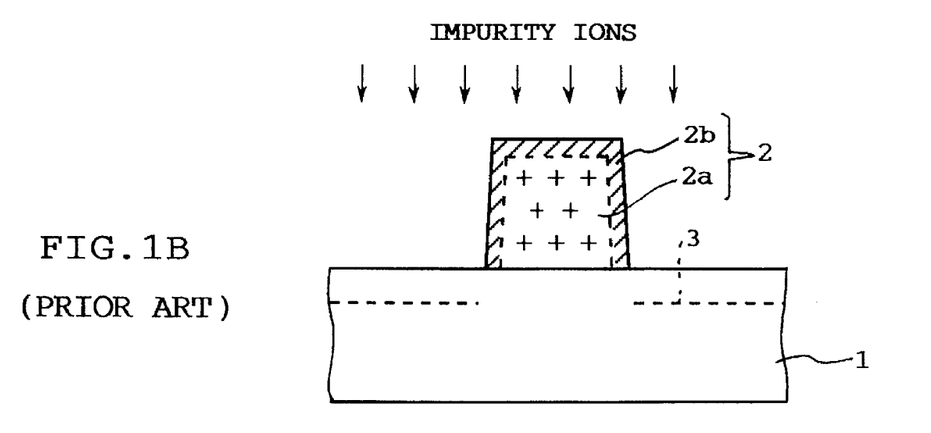

Next, as shown in FIG. 1B, impurity ions are implanted selectively into the semiconductor substrate 1 through the photoresist mask 2.

At the same time, impurities, such as P, B and As, are bonded chemically with the remaining photoresist polymer, and the surface layer of the photoresist mask 2 changes in quality and becomes a very hard layer. This hard layer is referred to as a carbonized layer (transmuted layer) 2b. Besides, the photoresist polymer inside the photoresist mask beyond reach of impurities remains in a state as it is. This interior layer is referred to as an un-changed layer (non-transmuted layer) 2a.

Then, ashing, using an oxygen plasma, is applied to the photoresist mask 2 so as to remove it.

Now, the ashing, using oxygen plasma, demolishes the carbonized layer 2b in the surface layer of the photoresist mask 2 by utilizing bombardment by ions in oxygen plasma, and also the photoresist mask is removed by utilizing an oxidation reaction between oxygen ions and the photoresist polymer.

Figure 1C:
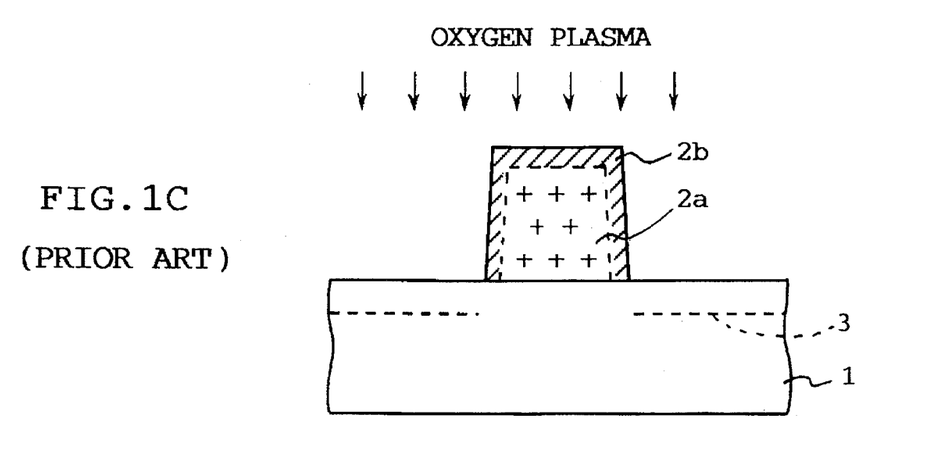

As shown in FIG. 1C, however, in ashing with oxygen plasma, impurities (such as P, B and As) implanted into the photoresist mask 2 and oxygen formed into plasma react with each other, and oxides of these impurities are produced. In particular, there is such a problem that those oxides of impurities formed in the ashing of the photoresist mask after ions are implanted at high dose, are difficult to volatilize. Therefore they remain on the substrate as it is.

Figure 1D:
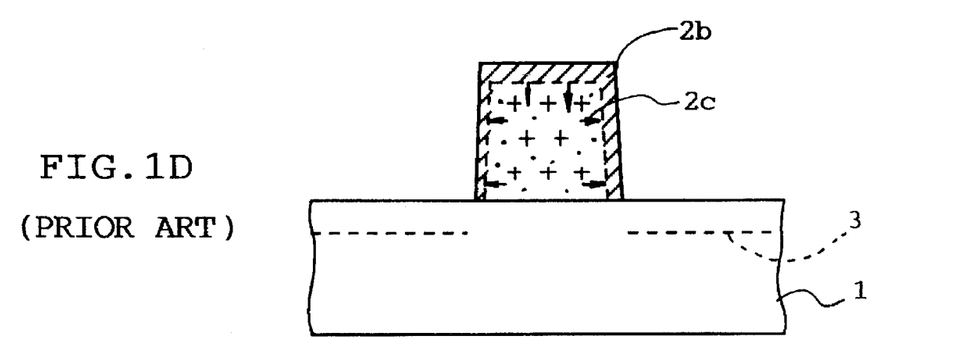
Figure 1E:
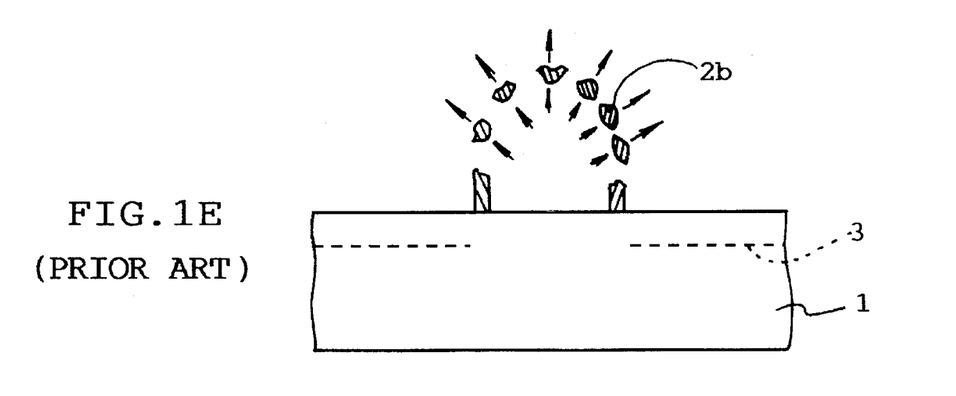

Further, when the wafer temperature rises, because of plasma irradiation, before the carbonized layer 2b is removed completely, volatile components inside the un-changed layer 2a are gasified and expanded as shown in FIG. 1D. In such a case, since the carbonized layer 2b which covers the un-changed layer 2a has a structure which is dense and does not pass gas 2c, what is called a "photoresist explosion", in which the carbonized layer 2b explodes becasue of the pressure of the expanded gas 2c, is generated as shown in FIG. 1E. Further, there is such a problem that the pieces of the carbonized layer 2b that have scattered by the photoresist explosion form particles, which cause lowering of production yield of semiconductor devices.

Accordingly, a method of performing hydrogen plasma processing, such that the wafer temperature is maintained at a low temperature, has been developed as a process in which the photoresist explosion is not brought about, and oxides of impurities are not produced. This processing method is called a 2-step ashing process, and has been announced already by the present inventor under a title of "High Ashing Rate of Ion Implanted Resist Layer" in DRY PROCESS SYMPOSIUM OF 1992.

It has been well known that a compound of an impurity (P, B or As) and hydrogen is liable to volatilize, and it was found that the carbonized layer had been removed without leaving residues when hydrogen plasma processing was performed practically. Further, since the wafer is cooled to a low temperature of approximately 5° C., the photoresist explosion has not occurred. Reactive ion etching (RIE) for removing the carbonized layer physically and chemically by hydrogen ions is suitable for the hydrogen plasma processing.

Further, after the carbonized layer is removed by the hydrogen plasma processing, the interior un-changed layer appears. In order to remove this un-changed layer, a downstream ashing process using $O_2$ as main reaction gas is very often applied because its process has less bombardment of the substrate by ions.

By applying the 2-step ashing processing in which the plasma processing by hydrogen gas and the downstream processing by oxygen gas described above are performed in succession, generation of oxides of impurities is prevented, and photoresist explosion is also prevented, thus greatly reducing the quantity of produced particles. With this, it is possible to aim at improvement of production yield of semiconductor devices.

Figure 2:
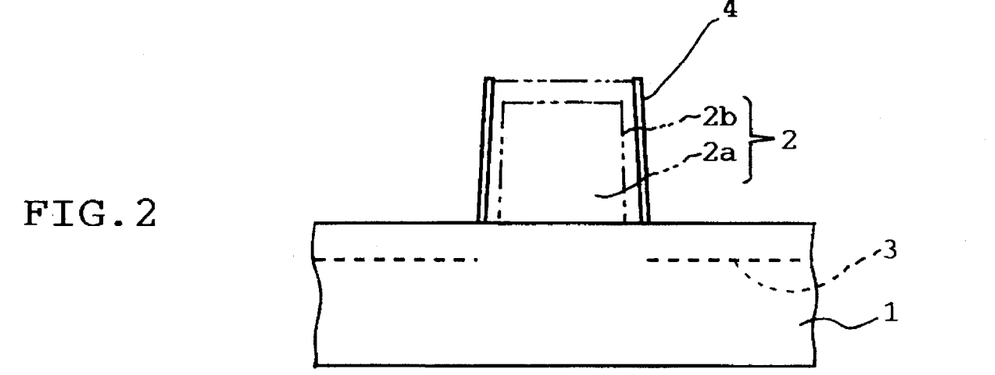
FIG. 2 is a sectional view showing problems in a conventional method of removing a photoresist mask.

When an ashing process is performed using this 2-step ashing process, however, new residues 4 remain along the side wall of the removed photoresist mask 2 sometimes as shown in FIG. 2, which becomes a problem.

SUMMARY OF THE INVENTION

It is an object of the present invention to provide a method of removing a resist mask and a method of manufacturing a semiconductor device, including a process of removing a resist mask, capable of preventing generation of oxides of impurities and what is called photoresist explosion so that no residues remain.

According to the investigation by the present inventor, it has been found from μ-Auger Electron Spectroscopy (AES) analysis that the residue remaining after the 2-step ashing process is performed contains alumina as a main component. Moreover, the residue remains on the side wall of the photoresist mask. This residue is of a type which is different from the residue composed of oxides of impurities which have been generated in oxygen plasma ashing, and such residues could not be found after the oxygen plasma ashing process giving rise to photoresist explosion. It is believed that this is because even the residues existing have been, for all practical purposes blown away by the photoresist explosion.

The origin of the alumina residues is conceivable to be aluminum from the component, of the ion implantation apparatus. This aluminum is partially vaporized, oxidized naturally into alumina residue, and then deposits on the side walls of the resist mask.

In order to remove the alumina residue described above, which has been ascertained through the investigation mentioned above, without exerting influence upon others, it is sufficient to expose the residue to chemicals which dissolve alumina, for example at least either nitric acid or phosphoric acid, before or after the 2-step ashing process. This method is effective not only with a mask composed of photoresist but also a mask composed of photosensitive polyimide.

Accordingly, in order to remove a mask remaining after impurity ions are implanted selectively into a substrate or the like, it is required to remove a carbonized layer in a surface layer containing impurities and an un-changed layer inside thereof by the 2-step ashing process, and to remove alumina residue remaining on the surface of the mask by chemical processing using nitric acid or phosphoric acid.

The 2-step ashing processing consists of plasma processing first by a gas containing hydrogen for removing the carbonized layer, and second, a downstream processing by a gas containing oxygen for removing the un-changed layer. Reactive ion etching (RIE) of the cathode-coupled parallel plate type is suitable for the plasma processing by a gas containing hydrogen. This is because, according to the RIE method, the carbonized layer is removed by chemical reaction while hydrogen ions having high energy bombard the wafer perpendicularly thereby to demolish the carbonized layer physically. The RIE of this type applies high frequency electric power between opposed electrodes, forms hydrogen gas, introduced in between the opposed electrodes, into plasma, and imposes the plasma onto a wafer placed on one of the opposed electrodes.

On the other hand, a method which forms gas containing oxygen into plasma, and exposes a mask on a substrate to activated gas remaining after removing ions from the gas formed into plasma so as to etch the mask, is suitable for the second, or downstream, ashing process by a gas containing oxygen. The reason for the above is that ion bombardment of the substrate is decreased so as to reduce the damage of the substrate to a minimum during the ashing process.

Besides, in order to increase the ashing rate, both in the plasma process and the downstream process, it is sufficient to add a small amount of water vapor to hydrogen or oxygen. This is because the generation efficiency of hydrogen atoms or oxygen atoms, which are reaction species for ashing, is increased by addition of a small amount of water vapor.

As described above, it is possible to remove the photoresist mask and the alumina residues completely by joint use of the 2-step ashing process and the chemical process with nitric acid or phosphoric acid. Further, it is possible to prevent generation of oxides of impurities and photoresist explosion so as to suppress the generation of particles.

DESCRIPTION OF THE PREFERRED EMBODIMENTS

Embodiments of the present invention will be described hereinafter with reference to the drawings. (1) Description of a method of manufacturing a semiconductor device including a method of removing a photoresist mask according to a first embodiment of the present invention.

In the method of removing a photoresist mask according to the first embodiment of the present invention, chemical processing with at least nitric acid and phosphoric acid is performed after the 2-step ashing processing.

(i) Description of an apparatus for 2-step ashing processing.

Figure 5:
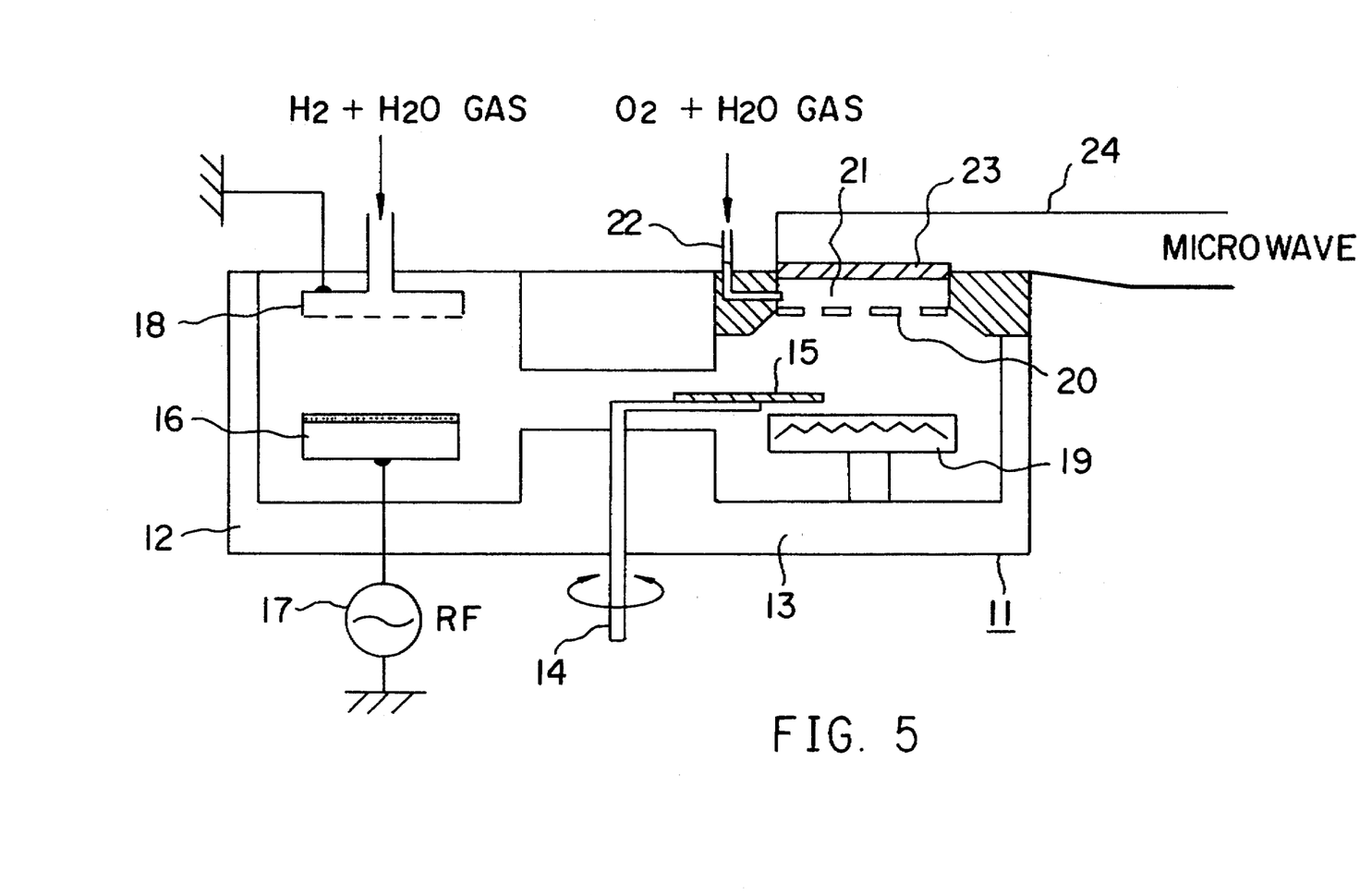
FIG. 5 is a side-view showing a structure of a 2-step ashing apparatus used in a method of removing a photoresist mask according to an embodiment of the present invention.

FIG. 5 is a side-view for explaining a structure of the 2-step ashing processing apparatus used in a method of removing a photoresist mask according to an embodiment of the present invention.

In FIG. 5, a reference numeral 11 represents an apparatus for 2-step ashing processing, in which a cathode-coupled parallel plate type RIE chamber 12 for performing hydrogen plasma processing and a downstream chamber 13 for performing oxygen plasma processing are combined with each other. Further, a wafer 15 to be processed is transported freely between the RIE chamber 12 and the downstream chamber 13 without touching the atmosphere by means of an arm 14 provided at a connected portion between the RIE chamber 12 and the downstream chamber 13.

The RIE chamber 12 has a structure as described hereinafter. Namely, the RIE chamber 12 is equipped with a cooling stage (placing table) 16 including means for placing the wafer 15 and cooling the placed wafer 15 and also serving as a cathode electrode among opposed electrodes, an RF power source 17 connected to the cooling stage 16 and for supplying electric power for forming the gas containing hydrogen (reaction gas) into plasma, and a plate-shaped gas shower 18 for supplying reaction gas onto the cooling stage 16 and serving also as an anode electrode among opposed electrodes.

Further, the downstream chamber 13 has a structure as described hereunder. Namely, the downstream chamber 13 is equipped with a heating stage (placing table) 19 for placing the wafer 15 (a substrate) and including a heater inside, a plasma chamber 21 partitioned from the downstream chamber 13 by a shower head 20 and into which the gas containing oxygen (reaction gas) is introduced, a gas inlet port 22 for introducing the gas containing oxygen into the plasma chamber 21 and a waveguide 24 partitioned from the plasma chamber 21 by a microwave transmitting window 23 and for introducing a microwave into the plasma chamber 21.

The processing is performed as follows using the apparatus 11 for the 2-step ashing processing described above.

First, the plasma processing in the RIE chamber 12 will be described. After a wafer is introduced into the RIE chamber 12, a gas containing hydrogen is introduced therein. The gas containing hydrogen is formed into a plasma by RF electric power applied between opposed electrodes 16 and 18 and pours onto the wafer 15. Since RIE is used at this time, hydrogen ions having high energy react on conductivity type impurities (P, B or As) while bombarding the wafer 15 perpendicularly thereby to physically demolish the carbonized layer. Further, the compounds of impurities and hydrogen volatilize easily, thus removing the carbonized layer an the surface of the photoresist mask.

Besides, since the cooling stage 16 has a means for cooling the wafer 15, it is possible to prevent photoresist explosion by cooling the wafer 15 to maintain it at approximately 5° C. for instance until the hydrogen and the impurities finish reacting with each other.

Next, the downstream processing in the downstream chamber 13 will be described hereinafter.

The gas containing oxygen is formed into a plasma in the plasma chamber 21 by the imposition of microwaves. Then, ions are removed out of the plasma due to a fact that the plasma flows into the downstream chamber 13 through the shower head 20. Furthermore, only activated gas containing no ions remaining thereafter contacts the wafer 15. The activated gas reacts on the un-changed layer of the photoresist mask, thereby to etch and remove the un-changed layer of the photoresist mask.

The reason why the downstream process by the gas containing oxygen is adopted is to reduce ion bombardment of the wafer 15 during the ashing process so as to keep the damage of the wafer 15 to the minimum.

Besides, in order to increase the ashing rate in the downstream processing, it is sufficient to add a small amount of water vapor to the hydrogen or oxygen. This is because the generation efficiency of hydrogen atoms, or oxygen atoms which are reaction species for ashing, is increased by the addition of a small amount of water vapor.

(ii) Description of a method of manufacturing a semiconductor device including a method of removing a photoresist mask.

FIG. 3A to FIG. 3E are sectional views showing a method of removing a photoresist mask after implanting impurity ions selectively into a semiconductor substrate for instance using a photoresist mask.

Figure 3A:
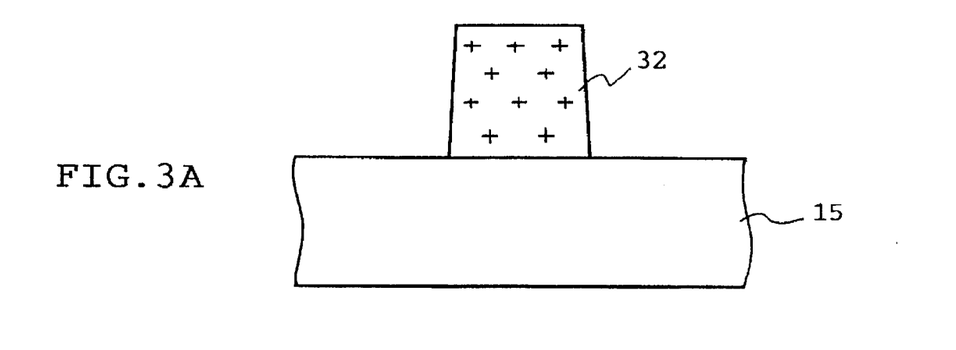
FIG. 3A to FIG. 3E are sectional views showing a method of manufacturing a semiconductor device including a method of removing a photoresist mask according to a first embodiment of the present invention.

First, a photoresist film is formed on a semiconductor substrate (a substrate wafer) 15, such as a silicon substrate, by a conventional application method. Then, after the photoresist film is exposed, it is soaked in a developer so as to form a photoresist mask 32 as shown in FIG. 3A.

Figure 3B:
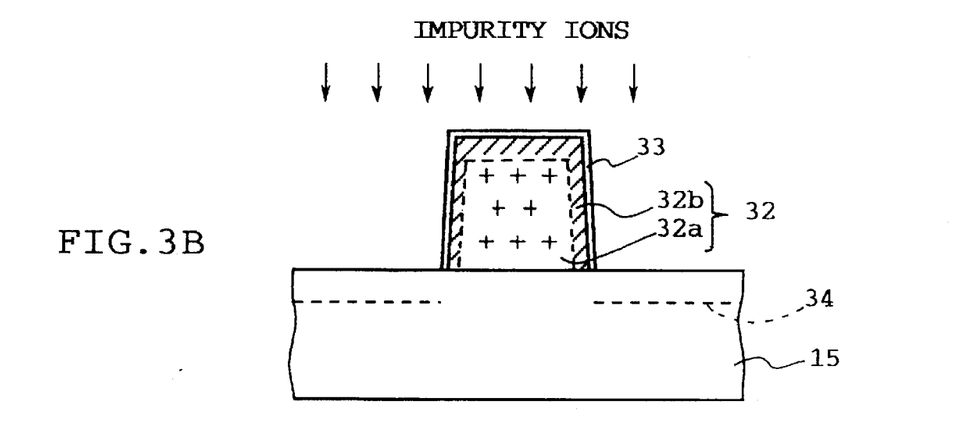

Next, as shown in FIG. 3B, impurity ions such as boron (B) are implanted selectively into the semiconductor substrate 15 which is exposed through the photoresist mask 32. By this process, an implanting layer 34 is formed.

At this time, aluminum is inadvertently sputtered from the apparatus for ion implantation and sticks to the side walls of the photoresist mask 32, and reacts further with residual oxygen, thus generating an alumina film 33. Further, impurities are bonded chemically with the photoresist polymer, thereby to form a very hard carbonized layer 32b on the surface layer of the photoresist mask 32. The thickness of the carbonized layer 32b depends on implantation energy of impurities. In the case of the energy needed for forming an ion implantation layer 34 of normal depth, it is estimated that the carbonized layer is approximately several hundred Å thick. The photoresist polymer inside the photoresist mask 32, beyond the reach of these impurities, remains as it is. This layer is referred to as an un-changed layer 32a.

Then, the wafer 15 is brought into the RIE chamber 12 of the apparatus for the 2-step ashing processing as shown in FIG. 5 and placed on the cooling stage 16. Then, the wafer 15 is cooled by the cooling means and maintained at 5° C.

Next, the pressure in the RIE chamber 12 is reduced, and, when it reaches a predetermined pressure, mixed gas of $H_2$ at a flow rate of 400 sccm and $H_2O$ at a flow rate of 100 sccm is introduced into the RIE chamber 12 and maintained at a pressure of 1 Torr.

Figure 3C:
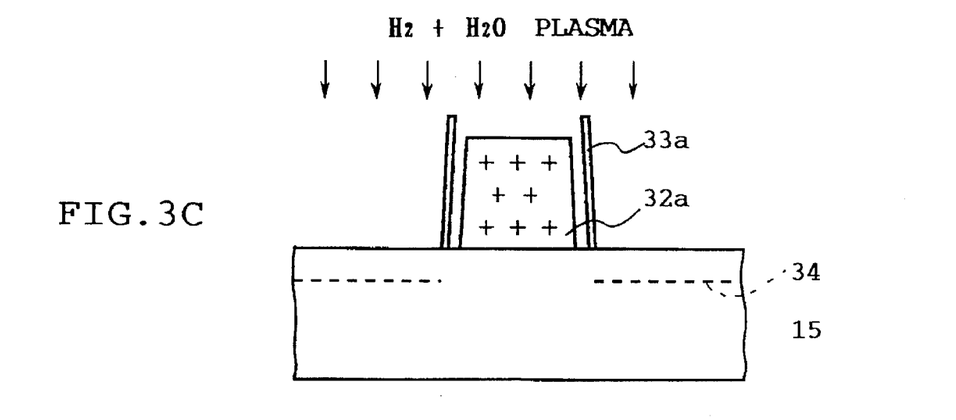

Then, RF power of 500W is applied between opposed electrodes 16 and 18. With this, a mixed gas of $H_2+H_2O$ is formed into a plasma. Further, hydrogen ions having high energy bombard the wafer perpendicularly and remove the carbonized layer 32b by chemical reaction while demolishing the carbonized layer 32b physically. After the carbonized layer 32b is removed, the interior un-changed layer 32a appears as shown in FIG. 3C. Besides, since a small amount of water vapor is added to hydrogen, the generation efficiency of hydrogen atoms, which are reactive species for ashing, is increased, and thus, the ashing rate becomes considerably high.

Next, the interior un-changed layer 32a which has become exposed is removed. For this purpose, the wafer 15, to be completed by plasma processing using the mixed gas of $O_2+H_2O$, is transported into the downstream chamber 13, and the wafer 15 is placed on the heating stage 19. Then, the wafer 15 is heated by the heating means and maintained at a temperature of 200° C.

Then, the pressure in the downstream chamber 13 in the plasma chamber 21 is reduced. When the pressure reaches a predetermined pressure, a mixed gas of $O_2$ at a flow rate of 1,350 sccm and $H_2O$ at a flow rate of 150 sccm is introduced into the plasma chamber 21 and maintained at a pressure of 1 Torr.

Figure 3D:
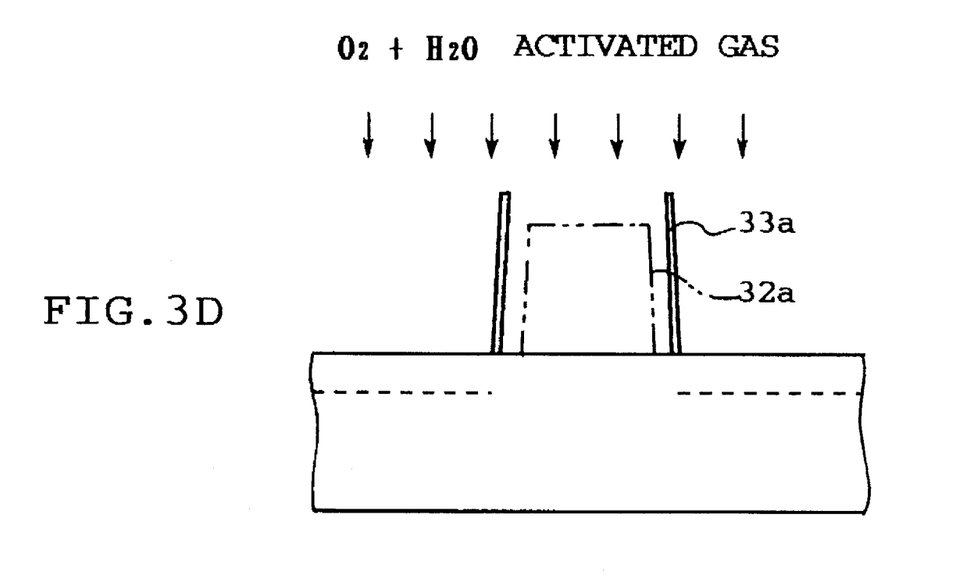

Next, microwave power of 1.5 KW with a frequency of 2.45 GHz is applied to a waveguide 24. With this, oxygen is formed into plasma and only neutral activated oxygen in the plasma flows downstream, and the un-changed layer 32a is removed as shown in FIG. 3D. However, the alumina residue 33a still remains without having been removed.

Figure 3E:
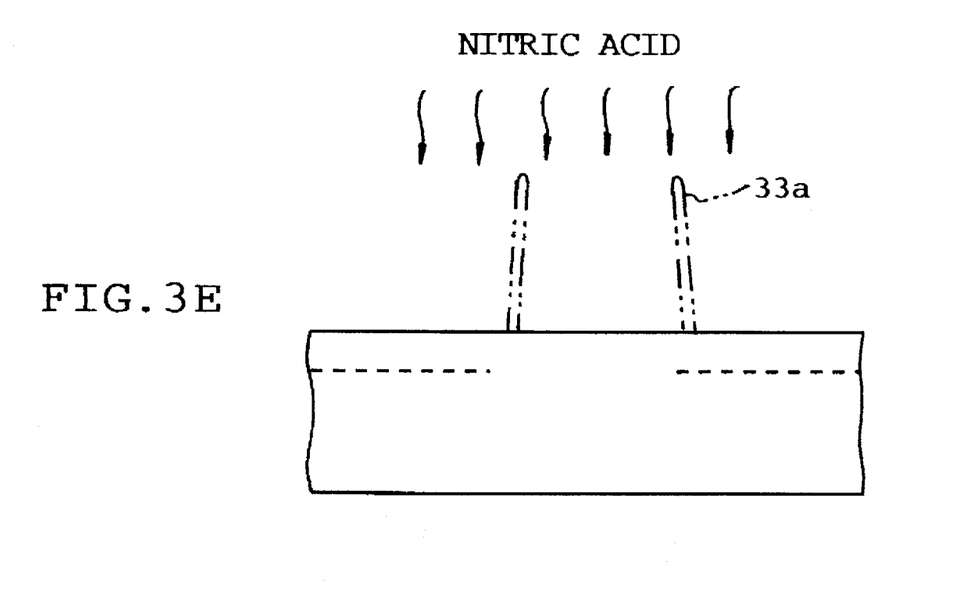

Then, in order to remove the alumina residue 33a, the wafer 15 is taken out of the processing apparatus. After a nitric acid solution is prepared, heated and maintained at 80° C., the wafer 15 is soaked for a period of approximately one minute as shown in FIG. 3E. With this, the alumina residue 33a is removed, thus completing the removal of the photoresist mask 32. Besides, in the processing by the nitric acid solution described above, the component ratio of the nitric acid solution, processing temperature and soaking period of time are not limited, but may be set optionally within a range that the alumina residue 33a can be removed.

As described above, according to the first embodiment of the present invention, chemical processing by nitric acid is performed after the 2-step ashing processing is performed.

Thus, the carbonized layer 32b in the surface layer of the photoresist mask 32 and the interior un-changed layer 32a are removed while preventing generation of impurity oxides and photoresist explosion by the 2-step ashing process. Furthermore, the alumina residue 33a which has been generated along the surface of the side wall of the photoresist mask 32 is removed by chemical processing using nitric acid.

With this, it is possible to remove the photoresist mask 32 and the alumina residue 33a completely, and also to prevent generation of impurity oxides and photoresist explosion whereby of the quantity of generated particles is reduced to eliminate.

Next, as showing some examples which the above method of removing a resist mask is applied to, it can be used in case of removing a used photoresist mask after selectively implanting impurity ions to form a source/drain of an insulated gate field effect transistor or to form wells as isolation regions or element forming regions in a semiconductor substrate or to give charges to an insulating layer.

Further, it can be used in case of removing a used photoresist mask after selectively implanting impurities into a steel to improve hardness and persistence or a silicon substrate for micro machines for similar purpose.

The case of selectively implanting impurities to form a source/drain region and thereafter removing a used photoresist mask is explained in the following. (2) Description of a method of manufacturing a semiconductor device including a method of removing a photoresist mask according to a second embodiment of the present invention.

In a method of removing a photoresist mask according to a second embodiment of the present invention, chemical processing using nitric acid is performed before the 2-step ashing process.

FIG. 4A to FIG. 4E are sectional views showing a method of removing a photoresist mask after selective ion implantation into a semiconductor substrate for instance using the photoresist mask.

Figure 4A:
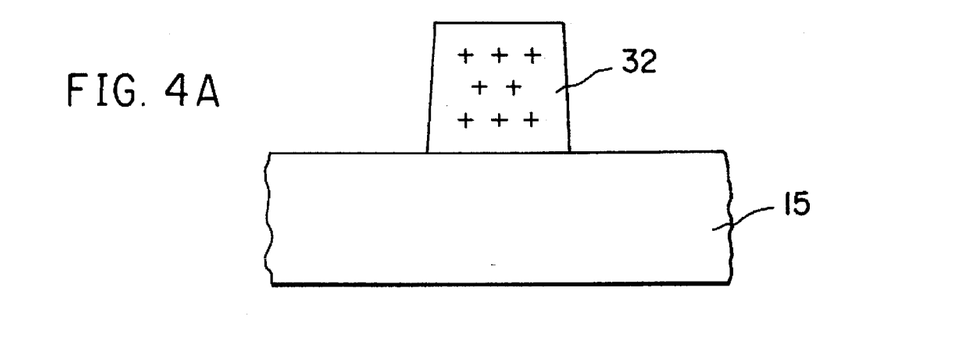
FIG. 4A to FIG. 4E are sectional views showing a method of manufacturing a semiconductor device including a method of removing a photoresist mask according to a second embodiment of the present invention.

First, as shown in FIG. 4A, a photoresist film is formed on a semiconductor substrate (wafer) 15 by an application method. Then, after the photoresist film is exposed, it is soaked in a developer, and the photoresist film is removed in a region where ion implantation is to be made is thus forming a photoresist mask 32.

Figure 4B:
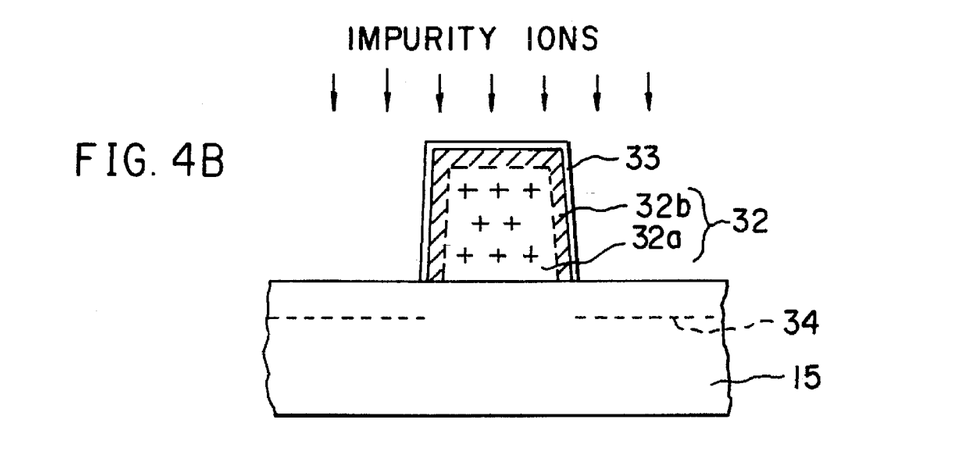

Next, impurities such as boron (B) are ion-implanted selectively into the semiconductor substrate 15 in the exposed areas through this photoresist mask 32.

At this time, aluminum is inadvertently sputtered from the chamber of the apparatus for ion implantation and sticks to the side wall of the photoresist mask 32, and it reacts further with residual oxygen and an alumina film 33 is generated. Further, impurities are bonded chemically with the photoresist polymer and the surface layer of the photoresist mask 32 becomes a very hard carbonized layer 32b. Besides, the photoresist polymer inside the photoresist mask 32 remains as an un-changed layer 32a.

Figure 4C:
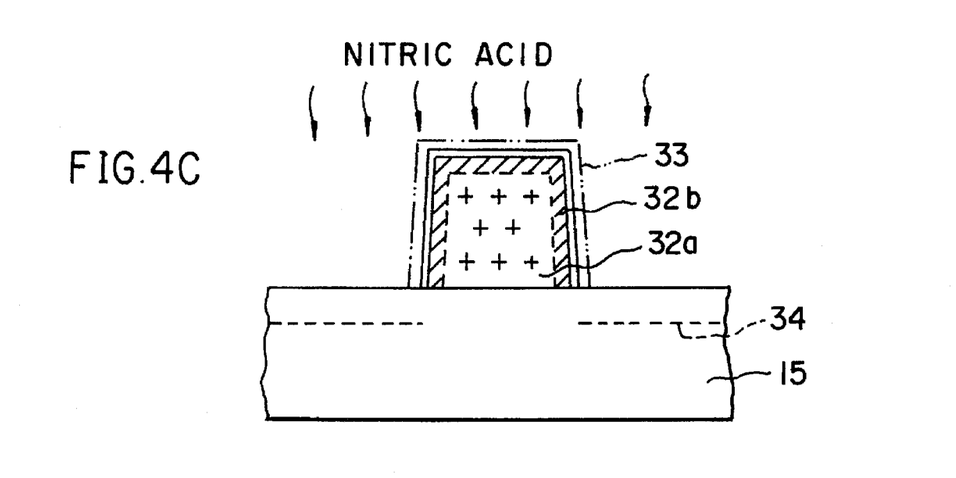

Then, in order to remove the alumina film 33, a nitric acid solution is prepared, heated and maintained at 80° C., and the wafer is soaked therein for approximately one minute thereafter. With this, the alumina film 33 stuck to the surface of the side wall of the photoresist mask 32 is removed.

Figure 4D:
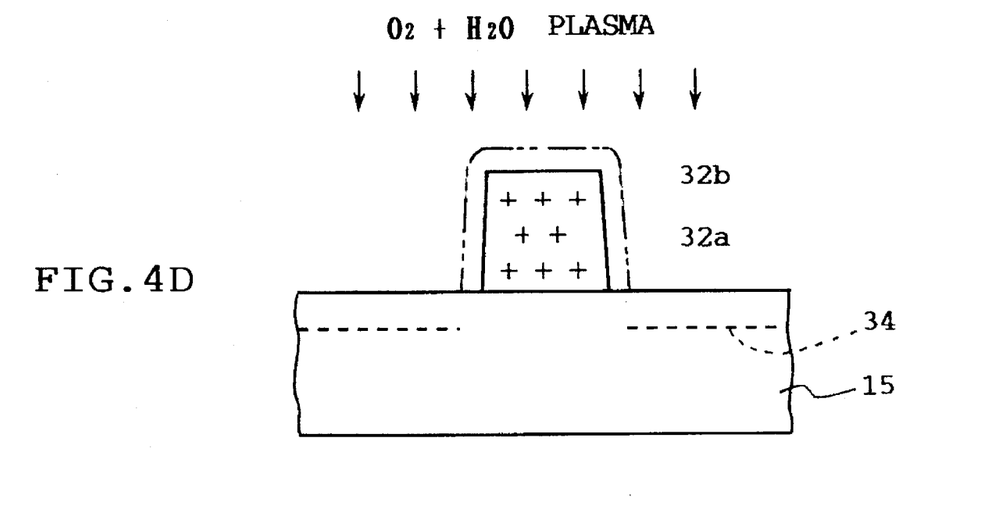
Figure 4E:
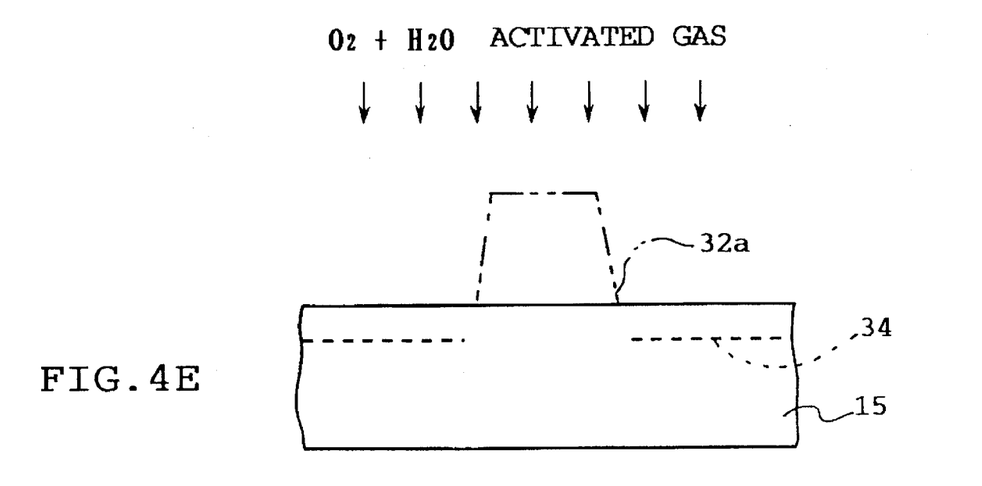

Next, processing similar to the 2-step ashing processing described in the first embodiment is performed by the apparatus for the 2-step ashing processing. The carbonized layer 32b is removed first by plasma processing using mixed gas of $H_2+H_2O$. Then, the interior un-changed layer 32a, which has appeared after hydrogen processing is removed by downstream processing using mixed gas of $O_2+H_2O$, thus completing removal of the photoresist mask 32.

As described above, according to the method of removing the photoresist mask of the second embodiment of the present invention, the 2-step ashing processing is performed after performing chemical processing with nitric acid.

Thus, the alumina film 33 on the side wall of the photoresist mask 32 is removed by chemical processing with nitric acid. Furthermore, by the 2-step ashing processing, the carbonized layer 32b in the surface layer of the photoresist mask 32 and the interior un-changed layer 32a are removed while preventing generation of impurity oxides and photoresist explosion.

With this, it is possible to remove the photoresist mask 32 and the alumina film 33 completely, and also to prevent generation of impurity oxides and photoresist explosion, thereby suppressing generation of particles.

Besides, in the first and the second embodiments, a nitric acid solution heated to 80° C. is used in order to remove the alumina residue 33a and the alumina film 33, but a phosphoric acid solution or a mixed solution of nitric acid plus phosphoric acid may be used. Further, the component ratio of the solution, processing temperature and soaking period of time can be set optionally within a range that the alumina residue 33a and the alumina film 33 can be removed.

Further, the present invention is applied to a case that the impurity is boron, but the present invention is also applicable to a case of other impurities such as P and As.

Furthermore, a semiconductor substrate such as a silicon substrate is used, but a polysilicon film and a polycide film may also be used as well as a semiconductor substrate composed of other materials.

Further, a photoresist containing novolak resin as base polymer is applicable as an exemplification of the photoresist. Moreover a resist of PMMA (polymethylmethacrylate) or alicyclic compound system is applicable. For example, a resist of a norbornene system or an adamanthyl system can be used as a resist of a typical allcyclic compound system. Furthermore, it is also possible to use a photosensitive polyimide as a resist.

The above-mentioned embodiment is applicable to a case that impurities such as boron and phosphorus are introduced into a semiconductor substrate or the like by ion implantation in order to form a pn junction such as a source/drain region and other conductive layers in a semiconductor layer on an insulating layer, a semiconductor substrate or the like in the manufacture of a field effect transistor, a semiconductor device of integrated circuit or the like.

What is claimed is:

1. A method of removing a resist mask on a substrate comprising the steps of:

(a) forming a mask comprising organic material on a surface layer of a substrate;

(b) implanting impurity ions into the surface layer through openings in the mask as well as into a surface layer of said mask thereby reacting said impurity ions with a surface portion of said mask and thereby forming a hard layer on a surface of said mask while leaving a substantially unreacted layer of said mask under said hard layer; and (c) removing the mask by sequentially:

(1) exposing the mask to a plasma activated gas containing hydrogen under conditions sufficient to vaporize said hard layer and thereby initiate removal of said mask, (2) after removal of said hard layer, exposing the mask to a plasma activated gas containing oxygen under conditions sufficient to remove said unreacted layer; and wherein, after said unreacted layer has been removed by said plasma activated gas containing oxygen to thereby completely remove said mask, aluminum oxide residues are left, (3) after removal of said mask by said oxygen, exposing said remaining aluminum oxide residues to a wet solution comprising an etchant consisting essentially of nitric acid under conditions sufficient to cause said nitric acid to remove said aluminum oxide residues.

2. A method of removing a resist mask according to claim 1, wherein the organic material is at least one of a photoresist and a photosensitive polyimide.

3. A method of removing a resist mask according to claim 1 wherein the surface layer of said substrate is at least one of a semiconductor layer, a semiconductor substrate, an insulating layer, and a metal layer.

4. A method of removing a resist mask according to claim 1, wherein the gas containing hydrogen is mixed gas of hydrogen and water vapor.

5. A method of removing a resist mask according to claim 1, wherein the surface layer of the mask is maintained at a temperature lower than the room temperature during exposing to the activated gas containing hydrogen.

6. A method of removing a resist mask according to claim 1:

placing the layer with the mask thereon on a cathode electrode;

forming gas containing hydrogen into plasma by applying, alternating electric power between the cathode electrode and an anode electrode opposing to the cathode electrode; and exposing the mask to the gas formed into plasma.

7. A method of removing a resist mask according to claim 1, wherein the gas containing oxygen is mixed gas of oxygen and water vapor.

8. A method of removing a resist mask according to claim 1, wherein the layer is maintained at a temperature higher than the room temperature during exposing to the activated gas containing oxygen.

9. A method of removing a resist mask according to claim 1 wherein said process of exposing said mask on said surface layer of said substrate to the activated gas containing oxygen is carried out after said exposing said mask to an activating gas containing hydrogen in a separate downstream process.

10. A method of removing a resist mask according to claim 9 wherein the step in which said mask is exposed to an activating gas containing oxygen comprises:

forming gas containing oxygen into a plasma;

removing ions from said oxygen containing plasma; and exposing the mask to the activated gas remaining after removing ions from the gas formed into plasma.

11. A method of manufacturing a semiconductor device comprising the steps of:

(a) forming a mask comprising organic material on a surface layer of a substrate;

(b) implanting impurity ions into the surface layer through openings in the mask as well as into a surface layer of said mask thereby reacting said impurity ions with a surface portion of said mask and thereby forming a hard layer on a surface of said mask while leaving a substantially unreacted layer of said mask under said hard layer; and wherein said mask further comprises aluminum-oxygen species:

(c) removing the mask by sequentially:

(1) exposing the mask to a plasma activated gas containing hydrogen under conditions sufficient to vaporize said hard layer and thereby initiate removal of said mask, and (2) after removal of said hard layer, exposing the mask to a plasma activated gas containing oxygen under conditions sufficient to remove said unreacted layer and to thereby complete removal of said mask and producing aluminum-oxygen species, and (3) exposing said aluminum-oxygen species on said substrate to a solution consisting essentially of nitric acid under conditions sufficient to remove aluminum oxide species.

12. A method as claimed in claim 1 wherein said step 3 is carried out at about 80° C.

13. A method as claimed in claim 1 wherein said mask comprises photosensitive organic material.

14. A method as claimed in claim 1 wherein said aluminum oxide residues are derived by sputtering of apparatus used in said ion implantation step.

15. A method as claimed in claim 11 wherein said step 3 is carried out at about 80° C.

16. A method as claimed in claim 11 wherein said mask comprises photosensitive organic material.

17. A method as claimed in claim 11 wherein said aluminum oxide residues are derived by sputtering of apparatus used in said ion implantation step.

18. A method of manufacturing a semiconductor device as claimed in claim 11 wherein said surface layer is at least one member selected from the group consisting of a semiconductor layer, a semiconductor substrate, and an insulating layer.

* * * * *